United States Patent
Jufer et al.

(10) Patent No.: US 9,516,767 B2
(45) Date of Patent: Dec. 6, 2016

(54) PORTABLE TACTILE ELECTRONIC OBJECT

(71) Applicant: ETA SA Manufacture Horlogere Suisse, Grenchen (CH)

(72) Inventors: Martin Jufer, Melchnau (CH); Stephan Schwegler, Zurich (CH); Sylvain Helfenstein, Lengnau (CH)

(73) Assignee: ETA SA Manufacture Horlogere Suisse, Grenchen (CH)

( * ) Notice: Subject to any disclaimer, the term of this patent is extended or adjusted under 35 U.S.C. 154(b) by 0 days.

(21) Appl. No.: 14/501,744

(22) Filed: Sep. 30, 2014

(65) Prior Publication Data

US 2015/0109744 A1     Apr. 23, 2015

(30) Foreign Application Priority Data

Oct. 18, 2013   (EP) .................................. 13189341

(51) Int. Cl.

| H05K 5/00 | (2006.01) |
|---|---|
| G04G 17/06 | (2006.01) |
| G04G 21/08 | (2010.01) |
| H05K 1/18 | (2006.01) |

(52) U.S. Cl.
CPC ............ *H05K 5/0017* (2013.01); *G04G 17/06* (2013.01); *G04G 21/08* (2013.01); *H05K 1/18* (2013.01)

(58) Field of Classification Search
USPC ......................................... 361/752, 748, 736
See application file for complete search history.

(56) References Cited

U.S. PATENT DOCUMENTS

| 4,064,688 A | 12/1977 | Sasaki et al. | |
|---|---|---|---|
| 4,255,802 A | 3/1981 | Ogawa | |
| 2002/0118605 A1* | 8/2002 | Born | G04G 21/08 368/69 |
| 2009/0046542 A1* | 2/2009 | Saunier | G04B 3/045 368/288 |
| 2011/0006993 A1 | 1/2011 | Longa | |
| 2012/0099406 A1 | 4/2012 | Lau et al. | |

FOREIGN PATENT DOCUMENTS

EP     2 273 348 A1     1/2011

OTHER PUBLICATIONS

European Search Report issued Apr. 3, 2014, in European Application No. 13189341 filed Oct. 18, 2013 (with English Translation).

* cited by examiner

*Primary Examiner* — Andargie M Aychillhum
(74) *Attorney, Agent, or Firm* — Oblon, McClelland, Maier & Neustadt, L.L.P.

(57) ABSTRACT

A portable electronic object is provided with a case including a middle part closed by a back cover and by a glass and a bezel fixed to the middle part. The case contains at least one electronic module formed of a printed circuit board to which is fixed at least one microcontroller sending information to a display. The object further includes a tactile control including at least one base element on which there is arranged at least one electrode. The electrode is electrically connected to the microcontroller by a conductive path.

16 Claims, 3 Drawing Sheets

PORTABLE TACTILE ELECTRONIC OBJECT

This application claims priority from European patent application No. 13189341.4 filed Oct. 18, 2013, the entire disclosure of which is hereby incorporated by reference.

The invention concerns a portable electronic object provided with a case including a middle part closed by a back cover and by a crystal and a bezel fixed to the middle part, said case containing at least one electronic module formed of a printed circuit board to which is fixed at least one control circuit sending data to display means, said object further including tactile control means including at least one substrate on which at least one electrode is deposited, said electrode being electrically connected to the control circuit by a conductive path.

BACKGROUND OF THE INVENTION

A portable electronic object, such as an electronic device or, for example, a portable timepiece, includes a case generally formed of a middle part closed by a back cover and by a glass. Inside the case is arranged a timepiece movement, which may be electromechanical or totally electronic. This timepiece movement is arranged to provide time information, said time information being displayed via analogue or digital display means. The timepiece further includes control means enabling the user to interact with said timepiece.

In general, the control means take the form of push buttons or a crown acting mechanically on said timepiece movement. These push buttons and crowns may be supplemented with a touch interface. This touch interface is used to improve the interactivity of the timepiece and to simplify handling especially when the timepiece proposes a significant number of menus and functions.

The touch interface may be a resistive touch interface or a capacitive touch interface. For the case of a capacitive touch interface, this may take the form of an electrode placed on the lower face of the glass, the glass being an electrically non-conductive element. The electrode is subjected to an electric field. When the user wishes to activate the interface, he exerts a contact force on the external face of the glass, preferably with his finger. This means that the contact force can be a tap or a light touch. This contact causes an additional capacitance to appear, formed between said electrode and the finger, which is an electrically conductive element. This variation in capacitance is detected by the electronic timepiece movement which will act according to its programming. This touch interface is created on the watch glass and not on the case since the latter is generally made of metal and is therefore electrically conductive. The case does not permit a capacitance to appear.

However, these touch interfaces arranged on the timepiece glass have the drawback of not permitting optimum visualisation of data. Indeed, the fact of having a touch interface arranged on the timepiece glass means that the user has to regularly place his fingers on the glass. Consequently, visualisation of the data displayed on the dial is regularly reduced by the user's fingers. The user therefore has more difficulty in reading the data provided by the timepiece.

Further, these touch keys are generally created by depositing a metal layer such as an indium-tin-oxide (ITO) layer on a substrate such as the glass. One drawback of applying this type of ITO layer onto the glass is that this is a complex and expensive operation. Consequently, extremely rigorous manufacturing is required to obtain a good production yield.

SUMMARY OF THE INVENTION

It is an object of the invention to overcome the drawbacks of the prior art by proposing to provide a portable electronic tactile object which is simpler to produce and less expensive and more flexible to use.

The invention therefore concerns a portable electronic object provided with a case including a middle part closed by a back cover and by a glass and a bezel fixed to the middle part, said case containing at least one electronic module formed of a printed circuit board to which is fixed at least one microcontroller sending data to display means, said object further including tactile control means including at least one base element on which at least one electrode is structured, said electrode being electrically connected to the microcontroller by a conductive path, characterized in that the base element is flexible so that it can be deformed to adapt to the shape of the portable object and be directly connected to the printed circuit board.

In a first advantageous embodiment, the base element is made of a plastic such as polyimide, the electrode being a layer of conductive materials deposited on said base element.

In a second advantageous embodiment, the tactile control means include a plurality of base elements on each of which there is arranged an electrode.

In a third advantageous embodiment, the tactile control means include a plurality of base elements on each of which there are arranged at least two electrodes.

In another advantageous embodiment, each base element includes a main section, connected via one of the ends thereof to the electronic module, and two arms extending on either side of the free end of said main section, the electrodes being arranged on said arms.

In another advantageous embodiment, the tactile control means include a base element on which is arranged a plurality of electrodes, said base element including a peripheral section connected by a secondary section to the electronic module, the electrodes being arranged on said peripheral section.

In another advantageous embodiment, said peripheral section of the base element has an identical shape to that of the case.

In another advantageous embodiment, the tactile control means are arranged on the bezel.

In another advantageous embodiment, the bezel is a fixed bezel.

In another advantageous embodiment, the bezel is a rotating bezel.

In another advantageous embodiment, the middle part and the bezel are in a single piece to form a middle part-bezel.

BRIEF DESCRIPTION OF THE DRAWINGS

The objects, advantages and features of the portable electronic device or object according to the present invention will appear more clearly in the following detailed description of at least one embodiment of the invention, given solely by way of non-limiting example and illustrated by the annexed drawings, in which.

DETAILED DESCRIPTION OF THE INVENTION

Figure 1:
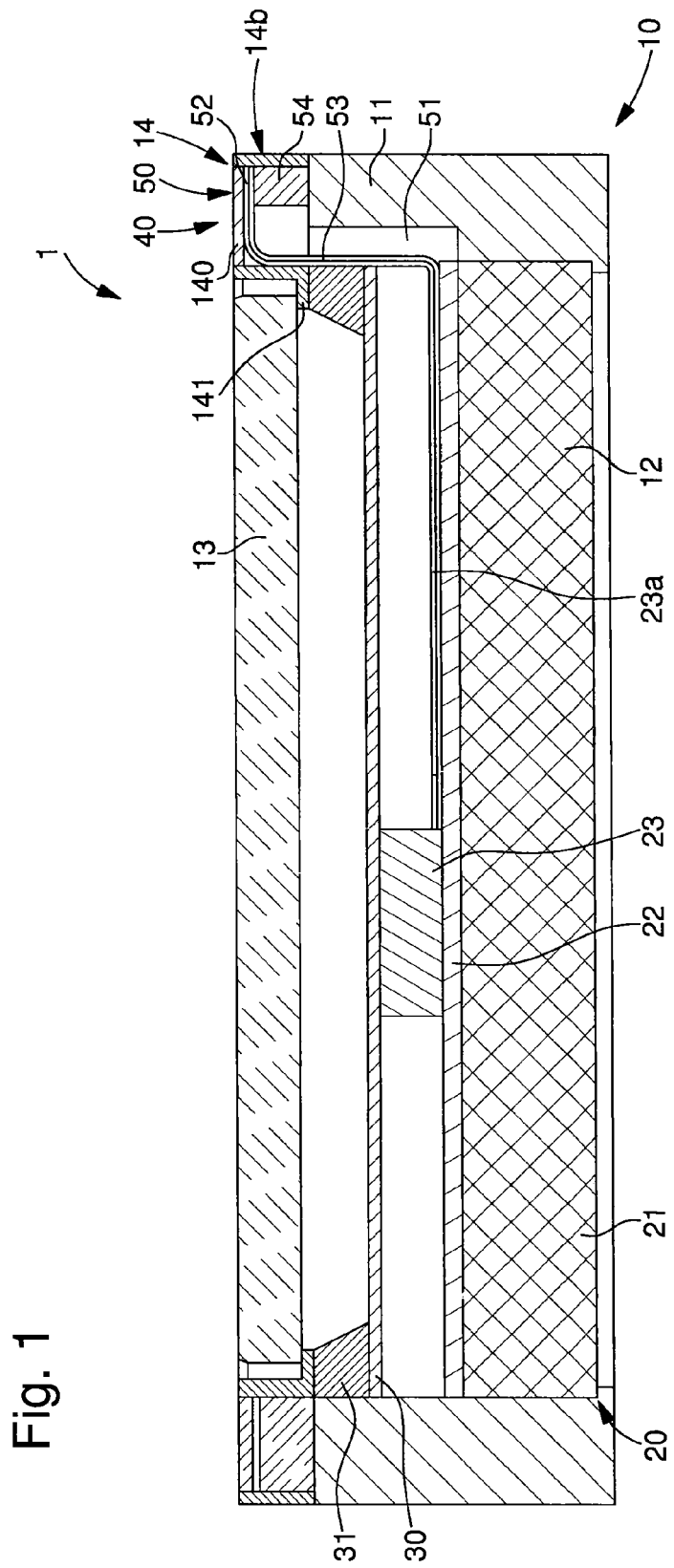
FIG. 1 is a schematic cross-section of a portable electronic object according to the invention.

FIG. 1 shows a portable electronic device 1 or portable electronic object according to the invention. This portable electronic object may be a mobile telephone or a mobile GPS device or a portable computer or a touch tablet, a heart rate monitor for sport or a portable music player or a timepiece.

This electronic device includes a case 10, formed of a middle part 11 closed by a back cover 12 (not shown in FIG. 1 but visible in FIG. 2) and by a glass 13. An electronic module 20 is arranged inside case 10. This electronic module 20 is configured to provide at least one piece of information required to be displayed on display means 30. This electronic module 20 is for example an electronic timepiece movement 11.

Module 20 in turn includes a plate 21 having a compartment or housing which is arranged to receive an electrical energy accumulator, particularly a cell battery.

Module 20 also includes at least one printed circuit board or PCB 22 fixed to said plate. On this printed circuit board 22, there is placed at least one microcontroller 23 configured to provide at least one item of data. Microcontroller 23 may also be an application specific integrated circuit (ASIC). This data is sent to display means 30 which may be analogue, such as hands, or digital such as an LCD screen. These display means are situated between glass 13 and electronic module 20, a spacer or flange 31 being arranged between glass 13 and display means 30.

Module 20 may also include various sensors such as, for example, a pressure sensor to provide altitude or depth or meteorological data. A temperature sensor or sensor for a compass function may also be provided. Further, it is possible to envisage arranging several electronic modules 20 inside case 10, each of them providing at least one data item for display means 30.

In the case where the portable electronic device is a timepiece, module 20 or one of modules 20 will be an electronic timepiece movement.

Timepiece 1 further includes control means 40 used to enable the user to interact with said module 20. This makes it possible for the user to select and activate the various functions. Control means 40 include at least tactile control means 50. The control means may also include push-pieces or buttons arranged on middle part 11.

Advantageously according to the invention, these tactile control means 50 include a flexible base element 51 fixed to electronic module 20 and on which there is arranged at least one electrode 52, said electrode 52 being structured on said flexible base element 51. This flexible base element 51 is advantageously a flexible printed circuit board, i.e. a high performance plastic substrate, such as polyimide (Kapton) or polyester. Deposited electrode 52 takes the form of a layer of conductive materials forming a connection point. For example, flexible printed circuit board 51 acting as a base element may be screen printed with silver on polyester or flexible printed circuit board 51 may be screen printed with copper on Kapton. Electrode 52 has a circular, parallelepiped or triangular shape.

To electrically connect electrode 52 to microcontroller 23, tactile control means 50 further include at least one connection path 53 arranged on said flexible base element 51. This connection path 53 cooperates with at least one electrical path 23a of printed circuit board 22 connected to said microcontroller. It is possible to use connection points on printed circuit board 22 and on base element 51 to ensure electrical continuity. An adhesive may be used to fix base element 51 to printed circuit board 22.

One advantage of using these flexible printed circuit boards 51 is that they allow for assembly with the components used for conventional printed circuit boards, while enabling the circuit to observe a particular shape, or bending during use.

Another advantage of using a flexible base element 51 is that the cost of this type of printed circuit board is lower than that of ITO layer deposition on a substrate such as the watch glass.

Finally, another advantage is the simplicity of the flexible printed circuit board 51. Indeed, the use of a flexible printed circuit board 51 not only imposes no restrictions on the components that can be used, but the present invention makes it possible to have a single piece acting as a base element for electrode 52 and connecting electrode 52 to the control circuit.

To achieve use close to that of existing watches with a touch glass, it is necessary to have a plurality of electrodes 52. In an advantageous arrangement, tactile control means 50 include twelve electrodes 52 each arranged on a base element 51; twelve base elements 51 are therefore necessary. These electrodes 52 are situated on the middle part so that the user can handle them. Of course, it is possible to choose the number of electrodes 52 and, for example, it is possible to only have one electrode 52 or to have 6 or 7.

Case 10 thus includes a bezel 14 for the arrangement of electrodes 52. This bezel 14 is situated on middle part 11 and surrounds glass 13. This may be a rotating bezel 14c or a fixed bezel 14b. Bezel 14 may also be arranged so that middle part 11 and bezel 14 form a single piece, i.e. a middle part-bezel 14a. Middle part 11 and bezel 14 have an external wall, which is the face seen by the user, and an internal wall. For electrodes 52 of tactile control means 50 to be efficient, this bezel 14 is made of a non-conductive material to allow the capacitive effect to occur. It is possible for the bezel not to be entirely made of non-conductive material but for only the area on which the user acts to be non-conductive. The sensitivity of the system is reduced but it still functions if the size of electrodes 52 is suitable, i.e. sufficiently large.

Preferably, base elements 51 and electrodes 52 are arranged on the hour circle so as to be easy to handle. These electrodes 52 are thus arranged on bezel 14, i.e. on middle part-bezel 14a, fixed bezel 14b or rotating bezel 14c.

Figure 3:
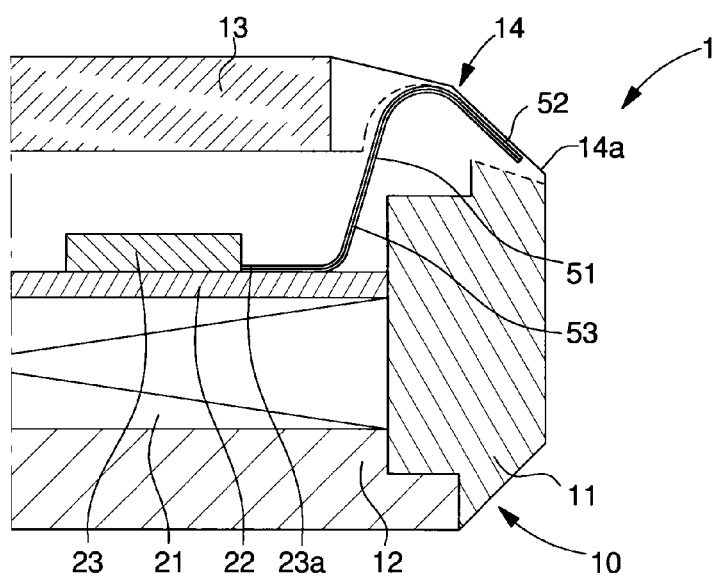
FIG. 3 is a schematic cross-section of an alternative portable electronic object with a bezel-middle part according to the invention.

In an alternative where electrodes 52 are arranged on middle part-bezel 14a, flexible printed circuit boards 51 are bent so that electrode 52 is in contact with the inner wall of middle part-bezel 14a, as seen in FIG. 3. It is possible to envisage hollowing the inner wall so that flexible printed circuit boards 51 can be wedged therein. It is also possible to bond said flexible printed circuit board 51 onto the inner wall.

In another alternative with a fixed bezel 14b seen in FIG. 1, the bezel takes the form of an annular part 140. In the example of FIG. 1, the annular part 140 of fixed bezel 14b has a U-shaped cross-section, the base of the U serving as the face seen by the user. The arm of this annular part which is located opposite the glass is provided with a bump 141 extending from the free end of the arm perpendicular to said arm. This bump 141 is used during the assembly of glass 13 and fixed bezel 14b, bezel 14b being pre-assembled to glass 13 so as to bear partly on flange 31. When glass 13 is assembled, the glass bears on bump 141 of annular part 140 of fixed bezel 14b. Fixed bezel 14b is thus wedged between glass 13 and middle part 11. This arrangement means that it is possible to have a fixed bezel 14b with a hollow inner space.

When electrodes 52 are arranged on fixed bezel 14b, the electrodes are in the hollow part of bezel 14b. For this purpose, middle part 11 is hollowed so that a passage is present between the electronic module 20 and the hollow inner space of the bezel as seen in FIG. 1. To hold flexible printed circuit board 51 in the hollow inner space of the bezel, the solution employed in FIG. 1 consists in using a wedge 54. This wedge 54 is placed in the hollow inner space of the bezel. Wedge 54 is arranged to be placed between flexible printed circuit board 51 and middle part 11. In this manner, wedge 54 acts on flexible printed circuit board 51 so that electrode 52 is in contact with the inner wall of bezel 14b.

Figure 2:
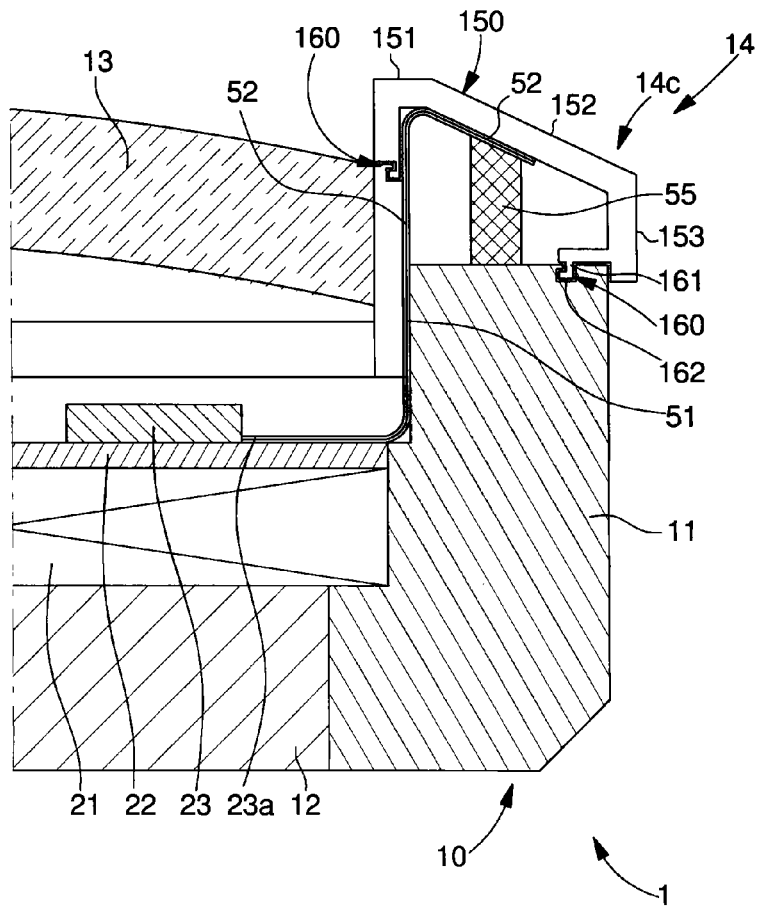
FIG. 2 is a schematic cross-section of an alternative portable electronic object with a rotating bezel according to the invention.

In another alternative with a rotating bezel 14c, the bezel also takes the form of an annular part 150. In the example of FIG. 2, annular part 150 of fixed bezel 14b has a section in three parts. This section is configured so that rotating bezel 14c is provided with flanks having a first portion 151 extending perpendicular to glass 13, a second portion 152 extending parallel to glass 13 and an inclined third portion 153 connecting first portion 151 and second portion 152. At the free end of first portion 151 and of third portion 153, attachment means 160 are provided. Attachment means 160 are male portions such as hooks 161 inserted into grooves 162 in middle part 11 acting as female parts. This middle part 11 then has a shoulder formed of two perpendicular walls on which the female parts are arranged. Annular part 150 of rotating bezel 14c and the shoulder of middle part 11 create an inner space.

When electrodes 52 are arranged on rotating bezel 14c, the electrodes are in the hollow part of bezel 14c. For this purpose, middle part 11 is hollowed so that a passage is present between electronic module 20 and the hollow inner space of rotating bezel 14c as seen in FIG. 2. To hold flexible printed circuit board 51 in the hollow inner space of rotating bezel 14c, the solution employed in FIG. 2 consists in using a wedge 55. This wedge 55 is placed in the hollow inner space of rotating bezel 14c. Wedge 55 is arranged to be placed between flexible printed circuit board 51 and middle part 11. In this way, wedge 55 supports flexible printed circuit board 51 so that electrode 52 is close to the inner wall of rotating bezel 14c without, however, entering into contact with rotating bezel 14c to permit the rotation of bezel 14c. It would also be possible to envisage a frame situated in the inner space formed by annular part 150 of rotating bezel 14c and the shoulder of the middle part. This frame makes it possible to support flexible printed circuit board 51.

Figure 4:
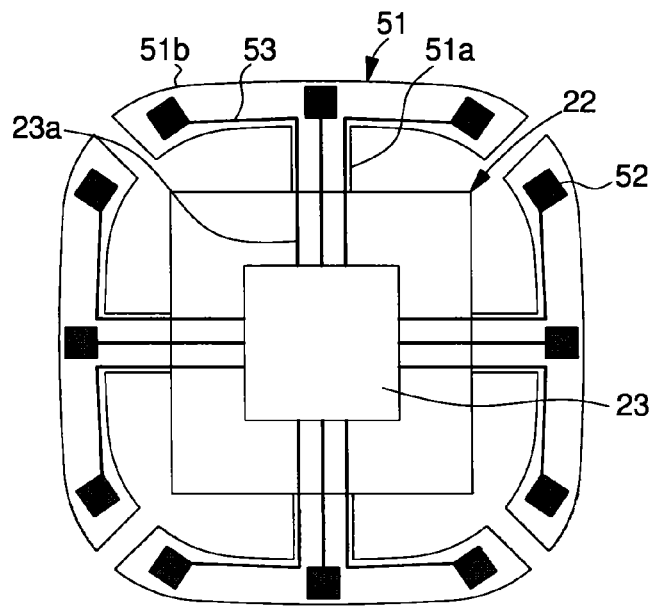
FIGS. 4 to 6 show schematic variants of the tactile means according to the invention.

In a first variant seen in FIG. 4, it is possible to have more than one electrode 52 per base element, i.e. per flexible printed circuit board 51. To achieve this, flexible printed circuit board 51 has a suitable shape. This suitable shape takes the form of a T, i.e. flexible printed circuit board 51 includes a main section 51a. This main section 51a is connected by one of the ends thereof to the electronic module, whereas two arms 51b extend on either side of the free end thereof. With this configuration it is possible to have the various electrodes 52 which are situated on the end of flexible printed circuit board 51 and on arms 51b. Conductive paths 53 then converge towards main section 51a and are then electrically connected to microcontroller 23. Preferably, arms 51b exhibit curvature to have a shape that matches that of bezel 14. This curvature of arms 51b allows for better integration of said flexible printed circuit board 51.

Thus, for an electronic object having twelve touch keys, it is possible to envisage having four flexible printed circuit boards 51 according to the present variant as seen in FIG. 4. Each flexible printed circuit board 51 carries three electrodes 52 and its arms 51b form an arc of a circle. The sum of the arcs of a circle of the four flexible printed circuit boards 51 is a circle similar to that formed by bezel 14.

Figure 5:
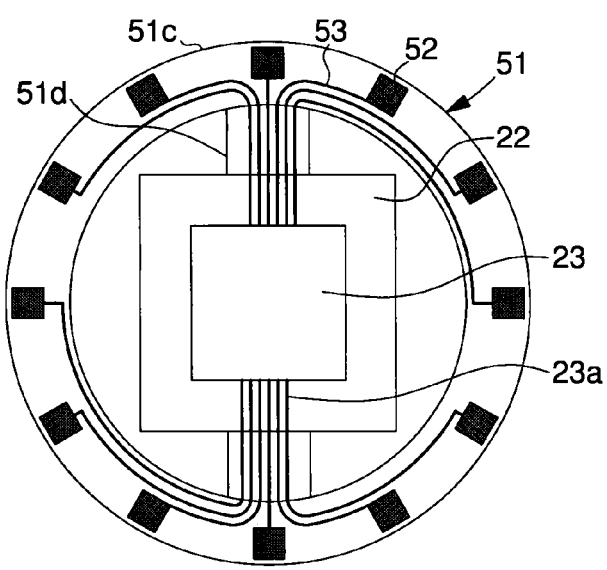

In a second variant visible in FIG. 5, tactile control means 50 include only one flexible printed circuit board 51 arranged to carry all the electrodes 52. To achieve this, flexible printed circuit board 51 includes a peripheral section 51c on which the various electrodes 52 are made. This peripheral section 51c has an identical shape to that of case 10, i.e. it may be annular or square or barrel-shaped. Peripheral section 51c is connected to microcontroller 23 of electronic module 20 by at least one secondary section 51d extending radially with respect to annular section 51c. Conductive paths 53 converge towards secondary section 51d to electrically connect electrodes 52 to microcontroller 23.

In a preferential version of this second variant visible in FIG. 5, flexible printed circuit board 51 has two secondary sections 51d. These secondary sections 51d are diametrically opposite. This preferential version has the advantage of simplifying the electrical connection between electrodes 52 and microcontroller 23. Conductive paths 53 are thus divided into two groups, each converging towards a secondary section 51d. It will be understood that the paths 53, which are angularly remote from a secondary section 51d at an angle of less than or equal to 90°, converge towards said secondary section 51d.

One advantage of this second variant is that it simplifies the manufacturing process since there is only one printed circuit board to be made and fixed to electronic module 20.

It will be clear that various alterations and/or improvements and/or combinations evident to those skilled in the art may be made to the various embodiments of the invention set out above without departing from the scope of the invention defined by the annexed claims.

Figure 6:
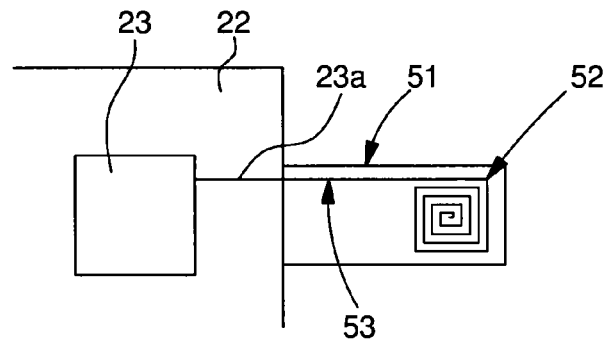

Thus, it is possible to envisage electrodes 52 taking the form of a conductive path 53 which, at its free end, is wound on itself, the path not entering into contact with itself as seen in FIG. 6.

What is claimed is:

1. A portable electronic object comprising:
   a case including a middle part closed by a back cover and by a glass and a bezel fixed to the middle part, said case containing at least one electronic module formed of a printed circuit board on which is fixed at least one microcontroller sending information to display means; and
   tactile control means including at least one base element on which a plurality of electrodes is structured, at least one electrode of the plurality of electrodes being positioned within the bezel and radially outside of the glass, said at least one electrode being electrically connected to the microcontroller by a conductive path, wherein the at least one base element is flexible in order to be deformable to adapt to the shape of the portable object and to be directly connected to the printed circuit board, wherein said at least one base element includes a peripheral section connected by a secondary section to the electronic module, the electrodes being arranged on said peripheral section.

2. The electronic object according to claim 1, wherein the base element is made of a plastic, the electrode being a layer of conductive materials deposited on said base element.

3. The electronic object according to claim 2, wherein the tactile control means include a plurality of base elements on each of which is arranged an electrode.

4. The electronic object according to claim 2, wherein the tactile control means include a plurality of base elements on each of which at least two electrodes are arranged.

5. The electronic object according to claim 4, wherein each base element includes a main section connected via one of the ends thereof to the electronic module and two arms extending on both sides of a free end of said main section, the electrodes being arranged on said arms.

6. The electronic object according to claim 1, wherein the tactile control means include a plurality of base elements on each of which is arranged an electrode.

7. The electronic object according to claim 1, wherein the tactile control means include a plurality of base elements on each of which at least two electrodes are arranged.

8. The electronic object according to claim 7, wherein each base element includes a main section connected via one of the ends thereof to the electronic module and two arms extending on both sides of a free end of said main section, the electrodes being arranged on said arms.

9. The electronic object according to claim 1, wherein said peripheral section of the base element has an identical shape to that of the case.

10. The electronic object according to claim 1, wherein the bezel is a fixed bezel.

11. The electronic object according to claim 1, wherein the bezel is a rotating bezel.

12. The electronic object according to claim 1, wherein the middle part and the bezel are in a single piece to form a middle part-bezel.

13. The electronic object according to claim 1, wherein said electrode is positioned entirely radially outside of the glass.

14. The electronic object according to claim 1, wherein said bezel has a hollow inner space and the electrode is positioned within the hollow inner space of the bezel.

15. The electronic object according to claim 14, wherein said bezel has a U-shaped cross section.

16. The electronic object according to claim 14, further comprising:
    a wedge positioned in the hollow inner space of the bezel, the wedge supports the electrode such that the electrode does not contact the bezel.

* * * * *